US009835677B2

(12) United States Patent
Wong et al.

(10) Patent No.: US 9,835,677 B2
(45) Date of Patent: Dec. 5, 2017

(54) METHOD AND SYSTEM FOR PRODUCING A SIGNAL WITH A POWER CHANGE DETERMINED BY A PHASE OR FREQUENCY DIFFERENCE BETWEEN TWO SIGNAL SOURCES

(75) Inventors: Kenneth H. Wong, Santa Rosa, CA (US); Robert E. Shoulders, Santa Rosa, CA (US); Joel P. Dunsmore, Sebastopol, CA (US); Thomas Reed, Santa Rosa, CA (US); Erwin F. Siegel, Windsor, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 1229 days.

(21) Appl. No.: 12/972,791

(22) Filed: Dec. 20, 2010

(65) Prior Publication Data

US 2012/0153933 A1   Jun. 21, 2012

(51) Int. Cl.
*G01R 23/20*    (2006.01)
*G01R 31/28*    (2006.01)
*G01R 27/28*    (2006.01)

(52) U.S. Cl.
CPC ......... *G01R 31/2839* (2013.01); *G01R 23/20* (2013.01); *G01R 27/28* (2013.01)

(58) Field of Classification Search
CPC ..... G01R 31/2839; G01R 23/20; G01R 27/28
USPC .......................................... 324/76.77, 76.41
See application file for complete search history.

(56) References Cited

U.S. PATENT DOCUMENTS

| | | | | |
|---|---|---|---|---|
| 3,619,774 A | * | 11/1971 | Landwehr | 324/613 |
| 3,835,392 A | * | 9/1974 | Mahner et al. | 455/138 |
| 4,246,535 A | * | 1/1981 | Huang et al. | 324/602 |
| 4,519,096 A | * | 5/1985 | Cerny, Jr. | 455/137 |
| 5,644,243 A | | 7/1997 | Reinhardt et al. | |
| 7,552,619 B2 | * | 6/2009 | Andle | 73/32 A |
| 2006/0252283 A1 | * | 11/2006 | Takeda et al. | 438/798 |
| 2008/0122427 A1 | * | 5/2008 | Wagner | 324/76.83 |

* cited by examiner

*Primary Examiner* — Jeff Natalini

(57) ABSTRACT

A system and method for determining the linearity of a device-under-test combine a first periodic signal and a second periodic signal to produce a combined signal, wherein the second periodic signal has at least one of a phase difference and a frequency difference with respect to the first periodic signal, and applying the combined signal to an input of the device-under-test. The linearity of the device-under-test is determined from an output signal of the device-under-test based on the at least one of the phase difference and frequency difference between the first periodic signal and the second periodic signal.

12 Claims, 10 Drawing Sheets

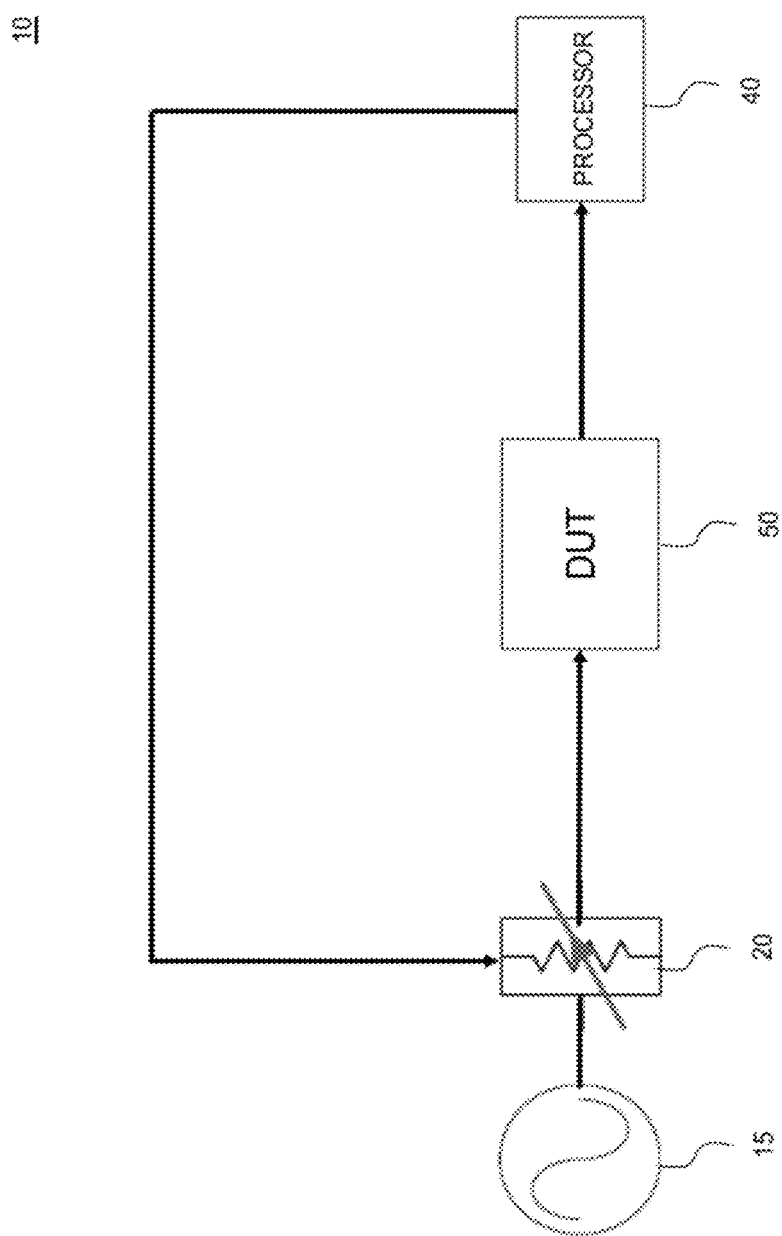

METHOD AND SYSTEM FOR PRODUCING A SIGNAL WITH A POWER CHANGE DETERMINED BY A PHASE OR FREQUENCY DIFFERENCE BETWEEN TWO SIGNAL SOURCES

BACKGROUND

Linearity is an important performance characteristic of many electronic devices. The linearity of a device may be defined as the degree to which the amplitude (or power) level of an output signal of the device is directly proportional to the amplitude (or power) level of an input signal provided to the device.

The slope of a plot of a device's output signal level versus the device's input signal level may be referred to as the device's gain. For many types of devices, ideally the device should have a perfectly linear response wherein the output signal level changes perfectly linearly in response to a change in the input signal level, yielding a constant gain.

However actual devices do not have perfectly linear responses, and thus there is some variation in the gain of the device as a function of one or more parameters. In many cases, it is desired to be able to determine and specify the linearity of a device as a function of some parameter (e.g., input signal level, frequency, input power level, temperature, input voltage level, etc.). Linearity may be specified in a number of different manners, but one common way to specify linearity is to identify the deviation of the device's actual output-signal-level-versus-input-signal-level response from a straight line over a given range of a particular parameter. Where a device's gain, G, is specified in decibels (dB), the device's linearity may be specified as the amount in dB that the actual output-signal-level-versus-input-signal-level varies from G. To illustrate, when an example amplifier has a nominal gain of 20 dB, the amplifier's linearity may be specified, for example, as "±0.50 db over an input signal level range from −80 dbm to −20 dbm." This is just one example manner of specifying a device's linearity which is provided for illustration purposes, and many other ways of specifying linearity are known to those of skill in the art.

One category of devices for which linearity may be an important performance characteristic includes detectors. As broadly defined here, a detector is a device which receives a receive signal and which, in response to the receive signal, outputs an output signal whose signal level may linearly track the signal level of the input signal. Examples of detectors include, without limitation, crystal detectors, diode detectors, amplifiers, mixers, down-converters, analog-to-digital converters (ADCs), and power meters.

FIG. 1A illustrates an arrangement 10 for measuring the linearity of a device-under-test (DUT) 50. The arrangement 10 includes a signal generator 15, a reference attenuator 20 and a processor 40. Of significance, in arrangement 10 reference attenuator 20 has a calibrated or otherwise predetermined attenuation characteristic, and attenuation characteristic data for reference attenuator 20 is available to processor 40 (e.g., stored in a memory accessible by processor 40). In some alternative arrangements, reference attenuator 20 could be replaced by a reference amplifier or other variable gain device with a calibrated or otherwise predetermined gain characteristic.

Arrangement 10 may be employed to determine the linearity of DUT 50 by changing an attenuation value of reference attenuator 20 to thereby change the power level supplied to DUT 50. Processor 40 may then compare the corresponding change in the output signal level produced by DUT 50 to the change in attenuation provided by reference attenuator 20 based on the attenuation characteristic data for reference attenuator 20. This measurement may be repeated for a number of different attenuation values in order to determine the linearity of DUT 50.

FIG. 1B illustrates another arrangement 11 for measuring the linearity of a DUT 50 that does not require a calibrated reference attenuator. The arrangement 11 includes a signal generator 15, an attenuator 25, a power splitter 30, a linear reference detector 35, and a processor 40. Of significance, in arrangement 11 linear reference detector 35 has a calibrated or otherwise predetermined linearity characteristic, and the linearity characteristic data for linear reference detector 35 is available to processor 40 (e.g., stored in a memory accessible by processor 40).

Arrangement 11 may be employed to determine the linearity of DUT 50 by changing an attenuation value of attenuator 25 to thereby change the power level supplied to both DUT 50 and linear reference detector 35 by the same amount. Processor 40 may then compare the corresponding changes in the output signal levels produced by DUT 50 and linear reference detector 35 in response to the change in their input signal levels, together with the linearity characteristic data for linear reference detector 35, in order to determine the linearity of DUT 50. In arrangement 11, attenuator 25 does not need to be calibrated or have a known attenuation response because whatever the actual attenuation change it provides between two different attenuator settings, the same attenuation in signal level is provided to both DUT 50 and linear reference detector 35.

The arrangements and techniques described above have some drawbacks, notably with respect to speed and accuracy. For example, in some cases, linearity tests must be able to determine the linearity of devices which employ high speed (e.g., 10 megasamples/second) analog-to-digital converters with more than 14 bits of resolution with quantization error reduction. In these cases, a very high degree of speed and accuracy is required. However, linear reference detectors such as that employed in arrangement 11 commonly require long measurement settling times. Also, arrangements 10 and 11 both depend upon the use of characteristic data for a calibrated or reference device (e.g., reference attenuator 20 or linear reference detector 35). So any change in this behavior after the reference device has been calibrated or characterized, or any error in characterizing the reference device, results in an inaccuracy or uncertainty in the linearity measurement of DUT 50.

Accordingly, it would be desirable to provide a method and system for determining the linearity of a device under test which does not depend upon having a calibrated reference attenuator or detector. It would also be desirable to provide a method and system for determining the linearity of a device under test which can avoid the long settling times associated with the use of linear reference detectors.

SUMMARY

In an example embodiment, a method comprises: combining a first periodic signal and a second periodic signal to produce a combined signal, wherein the second periodic signal has at least one of a phase difference and a frequency difference with respect to the first periodic signal; applying the combined signal to the input of a device; and determining a linearity of the device from an output signal of the device based on the at least one of the phase difference and frequency difference between the first periodic signal and the second periodic signal.

In another example embodiment, a system comprises: a first signal generator configured to output a first periodic signal; a second signal generator configured to output a second periodic signal, wherein the second periodic signal has at least one of a phase difference and a frequency difference with respect to the first periodic signal; a signal combiner configured to combine the first periodic signal and a second periodic signal to produce a combined signal and to supply the combined signal to a device; and a processor configured to determine a linearity of the device from an output signal of the device based on the at least one of the phase difference and frequency difference between the first periodic signal and the second periodic signal.

In yet another example embodiment, a system is configured to produce a signal with power change. The system comprises a first source and a second source, and the power change is determined by the one of a phase difference or a frequency difference between the first and second sources.

BRIEF DESCRIPTION OF THE DRAWINGS

The example embodiments are best understood from the following detailed description when read with the accompanying drawing figures. In fact, the dimensions may be arbitrarily increased or decreased for clarity of discussion. Wherever applicable and practical, like reference numerals refer to like elements.

FIGS. 1A-B illustrate two different arrangements for measuring the linearity of a device.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Unless otherwise noted, when a first device is said to be connected to a second device, this encompasses cases where one or more intermediate devices may be employed to connect the two devices to each other. However, when a first device is said to be directly connected to a second device, this encompasses only cases where the two devices are connected to each other without any intermediate or intervening devices. Similarly, when a signal is said to be coupled to a device, this encompasses cases where one or more intermediate devices may be employed to couple the signal to the device. However, when a signal is said to be directly coupled to a device, this encompasses only cases where the signal is directly coupled to the device without any intermediate or intervening devices.

Figure 2:
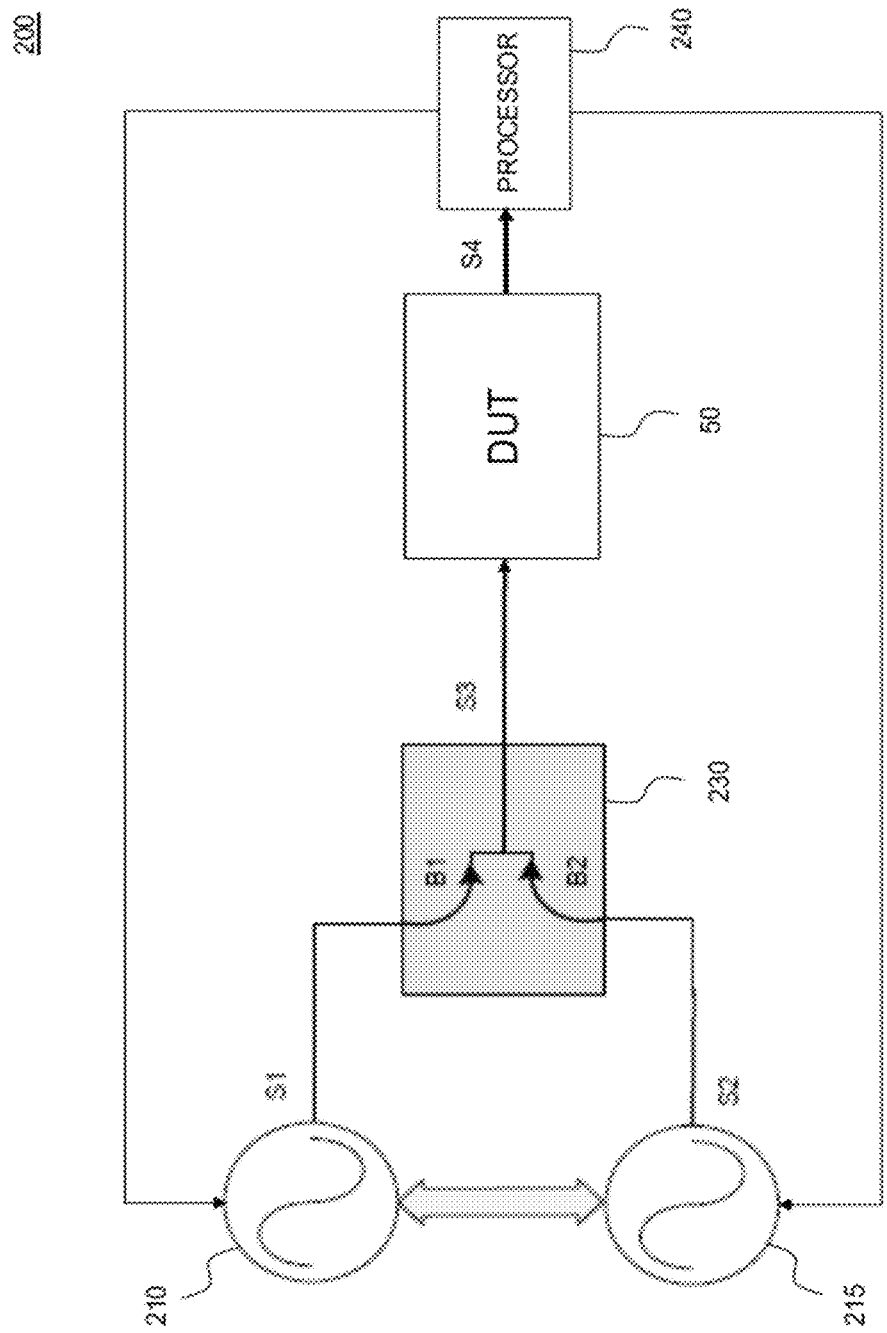
FIG. 2 illustrates one example embodiment of an arrangement for measuring the linearity of a device-under-test (DUT) using two periodic signals.

FIG. 2 illustrates one example embodiment of an arrangement 200 for measuring the linearity of a device-under-test (DUT) 50 using two periodic signals. The arrangement 200 includes: a first signal generator (or first source) 210, configured to output a first periodic signal S1; a second signal generator (or second source) 215 configured to output a second periodic signal S2; a signal combiner 230 configured to combine the first periodic signal (e.g., a sinusoidal signal) S1 and the second periodic signal (e.g., a sinusoidal signal) S2 to produce a combined signal S3, and to supply the combined signal S3 to DUT 50; and a processor 240 configured to receive an output signal S4 from DUT 50.

For simplicity of explanation, in the description to follow it is assumed that first periodic signal S1 and second periodic signal S2 are each sinusoidal signals, and they will be referred to hereafter as first sinusoidal signal S1 and second sinusoidal signal S2.

In a beneficial arrangement, as indicated by the bidirectional arrow in FIG. 2, first signal generator 210 and second signal generator 215 may be phase coherent with each other, meaning that their respective first and second sinusoidal signals S1 and S2 have a controlled relationship in frequency and phase with respect to each other. That is, second sinusoidal signal S2 may be offset in phase or frequency with respect to first sinusoidal signal S1, but the phase offset or frequency offset between first and second sinusoidal signals S1 and S2 does not drift to a significant degree over relevant time period for making a linearity measurement of DUT 50.

It is desirable that S3 be a linear combination of first and second sinusoidal signals S1 and S2, such that the second sinusoidal signal S2 does not appear on the port of signal combiner 230 connected to first signal generator 210, and that the first sinusoidal signal S1 does not appear on the port of signal combiner 230 connected to second signal generator 215. This prevents an interaction between first and second signal generators 210 and 215 that could change the power level that either signal generator transmits when the other signal generator is turned off. Therefore, in a beneficial feature, signal combiner 230 is an isolating signal combiner that provides signal isolation between its two input ports and their associated first and second signal generators 210 and 215. The level of isolation required to be provided by signal combiner 230 depends on the desired level of linearity measurement accuracy, and the dynamic range over which the linearity measurement is to be performed.

Processor 240 may be any kind of device that is capable of determining the linearity of DUT 50 based on the output signal S4 from DUT 50 according to any of the various embodiments of methods described below.

As described in greater detail below, in various embodiments processor 240 is configured to determine the linearity of DUT 50 from an output signal of DUT 50 based on a phase difference or a frequency difference between a component of the first periodic signal S1 present in the output signal S4 and a component of the second periodic signal S2 present in the output signal S4. In various embodiments, processor 240 may comprise: a central processing unit (CPU) or general purpose processor executing a set of instructions in accordance with software code stored in a memory device; a digital signal processor; an application specific integrated circuit (ASIC), a programmable gate array device, for example a field programmable gate array (FPGA); or any appropriate combination of hardware, firmware, and software.

The arrangement 200 may be employed by various embodiments of methods for determining the linearity of DUT 50. As described below, various embodiments eliminate reliance upon the linear behavior of a reference device such as a reference detector. In various embodiments, the power levels of the first and second sinusoidal signals S1 and S2 presented to signal combiner 230 are each held constant, and the power level of combined signal S3 presented to DUT 50 is not changed by a variable attenuator or other variable gain device, but instead by a mathematically predictable pattern based on the summation of the first and second sinusoidal signals S1 and S2 having a defined phase or frequency difference between them.

Figure 3:
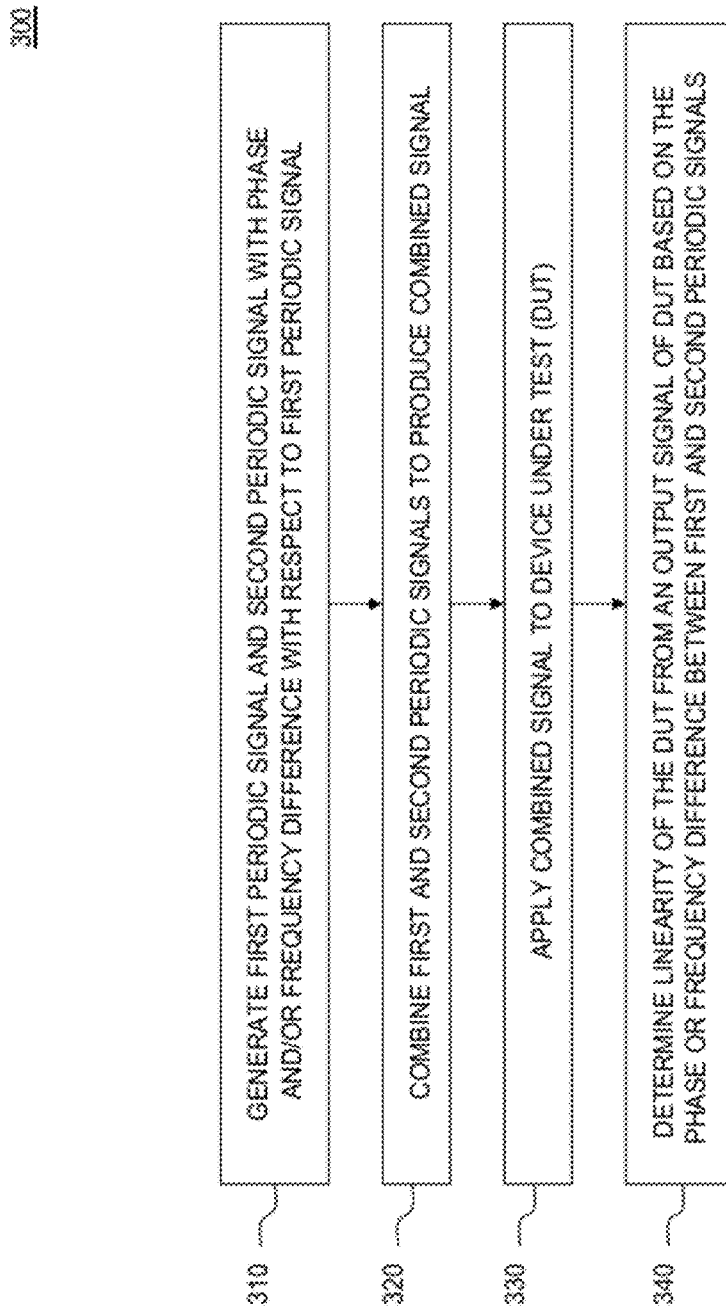
FIG. 3 is a flowchart of one embodiment of a method of determining the linearity of a DUT using two periodic signals.

FIG. 3 is a flowchart of one embodiment of a method 300 of determining the linearity of a DUT using two periodic signals. In some embodiments, method 300 may be performed using arrangement 200 of FIG. 2 to determine the linearity of DUT 50. For clarity of explanation, method 300 will be described with respect to arrangement 200, although it will be understood that the method may be performed using other arrangements, including for example the arrangements shown in FIGS. 5 and 7 which are described below.

In a step 310, a first periodic signal (e.g., the first sinusoidal signal S1) is generated, and a second periodic signal (e.g., the second sinusoidal signal S2) is generated, where second sinusoidal signal has a phase and/or frequency difference or offset with respect to first sinusoidal signal S1. In some embodiments as described below, processor 240 supplies one or more control signals to one or both of first signal generator 210 and second signal generator 215 as illustrated in FIG. 2 to control a frequency and/or phase of the first periodic signal S1 and/or the second periodic signal S2.

In a step 320, the first sinusoidal signal S1 and the second sinusoidal signal S2 are combined by signal combiner 230 to produce a combined signal S3.

In a step 330, the combined signal S3 is applied to DUT 50. In response, DUT 50 generates an output signal S4.

In a step 340, the linearity of DUT 50 is determined from output signal S4 based on the phase or frequency difference between the first and second sinusoidal signals S1 and S2. In particular, in some embodiments the second sinusoidal signal S2 has the same frequency as the first sinusoidal signal S1, but has a phase difference with respect to the first sinusoidal signal S1, and that phase difference is varied to determine the linearity of DUT 50. In other embodiments, the second sinusoidal signal S2 has a frequency difference with respect to the first sinusoidal signal S1 that produces a predetermined time-varying magnitude for the combined signal S3 that depends on that frequency difference, and the output signal S4 of DUT 50 is compared to the expected response of an ideal DUT when receiving the combined signal S3 having the predetermined time-varying magnitude, in order to determine the linearity of DUT 50.

Detailed explanations of example embodiments of method 300 will now be provided.

In a first example embodiment of method 300 of determining the linearity of DUT 50, the second periodic signal S2 has a phase difference with respect to the first periodic signal S1, and this phase difference is varied to determine the linearity of DUT 50. A more detailed description of such an example embodiment is now provided.

In general, one can express the first and second periodic signals S1 and S2 having the same frequency, but having a phase difference with respect to each other, as:

$$S1 = A1 * \cos(\omega * t + \phi), \text{ and} \quad (1)$$

$$S2 = A2 * \cos(\omega * t + \theta), \quad (2)$$

where $\omega = 2\pi f$, f=frequency, t=time, and $\phi$ & $\theta$ and A1 & A2 are scalar constants, and A1 and A2 represent the peak amplitudes of S1 and S2, respectively.

The combined signal, S3, is the sum of S1 and S2, with an additional gain factor and phase offset due to the loss and delay of signal combiner 230, and can be expressed as:

$$S3 = B1 * \cos(\omega * t + \phi') + B2 * \cos(\omega * t + \theta'), \quad (3)$$

where $\phi'$ and $\theta'$ are scalar constants representing the phase values $\phi$ and $\theta$, respectively, phase shifted by corresponding phase amounts by signal combiner 230, and B1 and B2 are scalar constants representing the peak amplitudes A1 and A2, respectively, adjusted by corresponding amplitude gains/losses from signal combiner 230. Thus it is seen that the combined signal S3 includes a component of the first periodic signal S1, having a peak amplitude B1 and a phase value $\phi'$, and further includes a component of the second periodic signal S2 having a peak amplitude B2 and a phase value $\theta'$.

Although in general B1 and B2 can have any realizable values, in a beneficial embodiment, A1 and A2 are selected such that the peak amplitude of the component of the first periodic signal present in the combined signal, B1 equals the peak amplitude of the component of the second periodic signal present in the combined signal, B2. In that case:

$$S3 = 2 * B1 * \cos\left(\frac{\phi' - \theta'}{2}\right) * \cos[\omega * t + \Phi] = B3\cos[\omega * t + \Phi], \quad (4)$$

where:

$$B3 = 2 * B1 * \cos\left(\frac{\Delta\vartheta}{2}\right); \quad (5)$$

$$\Delta\vartheta = \phi' - \theta'; \text{ and} \quad (6)$$

$$\Phi = \frac{(\phi' + \theta')}{2}. \quad (7)$$

When DUT 50 is a typical detector, it will detect the envelope of the combined signal S3 which is the absolute value or magnitude of B3. Thus, as shown in equation (4), by varying the phase difference $\Delta\theta$ between the phase $\phi'$ of the component of the first periodic signal S1 present in the combined signal S3, and the phase $\theta'$ of the component of the second periodic signal S2 present in the combined signal S3, one can vary the value of B3. Since the power level of the combined signal S3 is proportional to the square of the magnitude or absolute value of B3, then for a constant impedance system the ratio of the power incident upon DUT 50 for two phase difference values, $\Delta\theta_1$ and $\Delta\theta_2$, is:

$$\frac{|S3_2|^2}{|S3_1|^2} = \frac{\left|\cos\left(\frac{\Delta\vartheta_2}{2}\right)\right|^2}{\left|\cos\left(\frac{\Delta\vartheta_1}{2}\right)\right|^2}, \quad (8)$$

where $S3_1$ is the combined signal for the phase difference value $\Delta\theta_1$, and $S3_2$ is the combined signal for the phase difference value $\Delta\theta_2$.

It should be noted that the amplitude B1 (=B2) is constant and drops out of equation (8), so that the measurements do not depend on the amplitudes of the first and second sinusoidal signals S1 and S2. It should also be noted that the phase difference $\Delta\theta$ depends on the phase values $\phi$ and $\theta$ of the first and second sinusoidal signals S1 and S2, so—for example—the phase difference $\Delta\theta$ can be changed from $\Delta\theta_1$ to $\Delta\theta_2$ by adjusting the phase value $\phi$ or $\theta$ of the corresponding one of the first and second signal generators 210 and 215 while keeping the other phase value constant.

In general, to measure the linearity of DUT 50, in one example embodiment the phase value $\theta$ of second signal generator 215 is kept constant while the phase value $\phi$ of first signal generator 210 is varied to cause the phase difference $\Delta\theta$ have a plurality of different values over a desired phase difference range, and the output signal S4 of DUT 50 is analyzed by processor 240 to compare the measured response of DUT 50 to the theoretical response for an ideal linear device as provided in equation (8).

Figure 4:
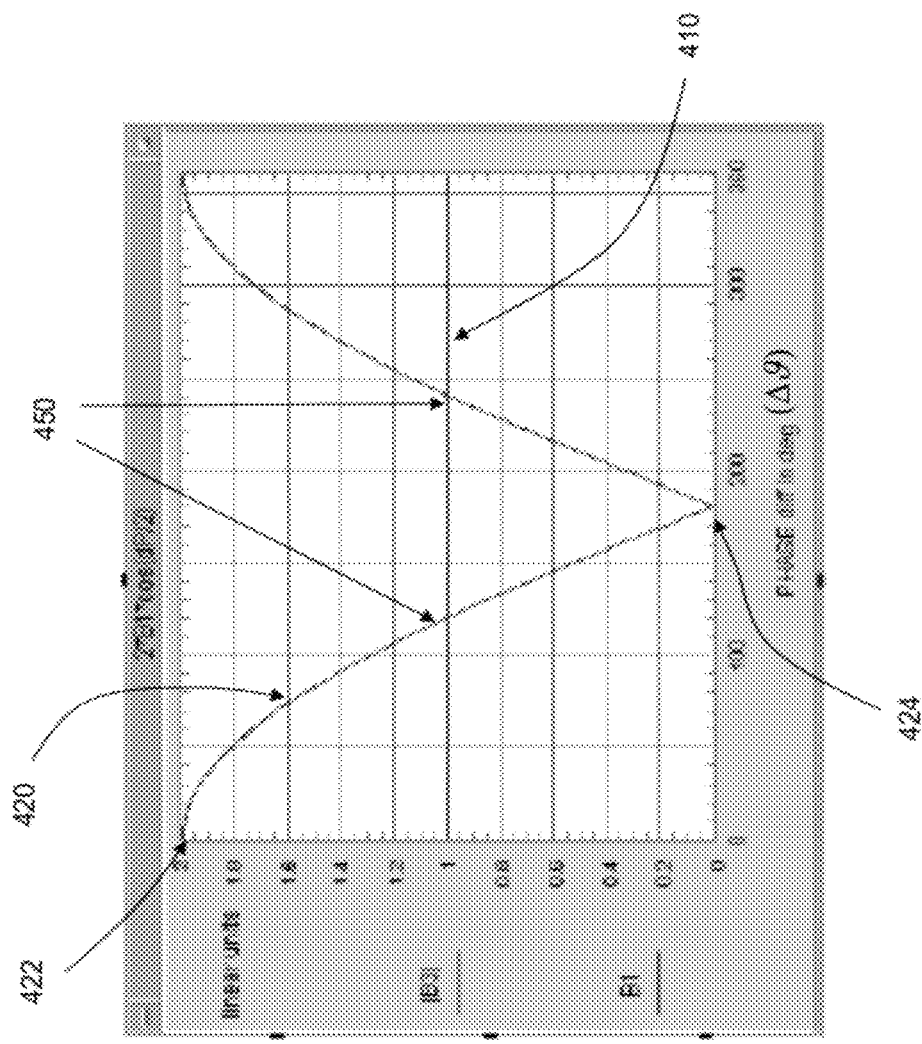
FIG. 4 illustrates one example embodiment of an ideal output response of a DUT in the arrangement of FIG. 2.

FIG. 4 illustrates one example embodiment of an output response of DUT 50 in the arrangement of FIG. 2 as a function of the phase difference $\Delta\theta$ between the component of the first periodic signal S1 present in combined signal S3, and the component of the second periodic signal S2 present in combined signal S3, when DUT 50 is an ideal device. In FIG. 4, the solid line 410 represents the peak amplitude B1 (=B2, as described above), and the dotted curve 420 represents the absolute value or magnitude of the peak amplitude B3 (normalized with respect to B1) of the combined signal S3 at the input of DUT 50 as a function of the phase difference $\Delta\theta$ between the component of the first periodic signal S1 present in the combined signal S3, and the component of the second periodic signal S2 present in S3. As can be seen in FIG. 4, dotted curve 420 represents the absolute value or magnitude of a cosine function, and particularly:

$$|B3| = \left|2 * B1 * \cos\left(\frac{\Delta\vartheta}{2}\right)\right|. \quad (9)$$

The method of measuring the linearity of DUT 50 described above assumes that the amplitude B2=B1, and that the phase difference $\Delta\theta$ is either known or can be determined for each measurement point at which the output signal S4 is analyzed. Several different methods for setting the amplitude B2=B1, and for determining the phase difference $\Delta\theta$ may be employed.

In one embodiment, the phase difference $\Delta\theta$ is controlled by controlling the phase(s) of one or both of first and second signal generators 210 and 215. In an example embodiment as shown in FIG. 2, processor 240 may provide one or more control signals to one or both of first and second signal generators 210 and 215 for controlling the phase(s) of the first and/or second sinusoidal signal(s) S1 and/or S2. In particular, processor 240 may vary the phase difference $\Delta\theta$ in known increments and analyze the output signal S4 of DUT 50 as the phase difference is varied to find the maximum point 422, the minimum point 424, and/or the single power point 450 (i.e., the point where $B3^2=B1^2$) as shown in FIG. 4. Further known changes in the phase difference $\Delta\theta$ may then be used to change the power of the combined signal S3 supplied to DUT 50 according to equation (5). The linearity of DUT 50 may be determined by comparing the measured change from the output signal S4 of DUT 50 to the change in the absolute value or magnitude of the peak amplitude of S3 at different phase differences $\Delta\theta$ according to equation (8) and/or FIG. 4.

In one embodiment, the amplitudes B1 and B2 can be set equal to each other as follows. First, the sinusoidal signal S2 from second signal generator 215 is turned off (for example by a switch), as a result of which the amplitude of the first sinusoidal signal applied to signal combiner 230 is set to zero, and the power level $B3^2=B1^2$. Then the combined signal S3 having the power level $B3^2$ is applied to DUT 50 while the peak amplitude A1 is adjusted until the output signal S4 indicates a first value for B1. Next, the first sinusoidal signal S1 from first signal generator 210 is turned off (for example by a switch), as a result of which the amplitude of the second sinusoidal signal applied to signal combiner 230 is set to zero, and the power level $B3^2=B2^2$, and then A2 is adjusted until the output signal S4 indicates the same first value for B1 as was determined before. At that point, B2 will be equal to B1. It should be noted that by requiring only that B1 and B2 be fixed at the same value, DUT 50 need not be linear, as long as its output signal S4 has a unique value or level for each input power level $B3^2$. It should also be noted that the power level where B2=B1 also provides markers for the phase difference response, as discussed above with respect to FIG. 4.

Figure 5:
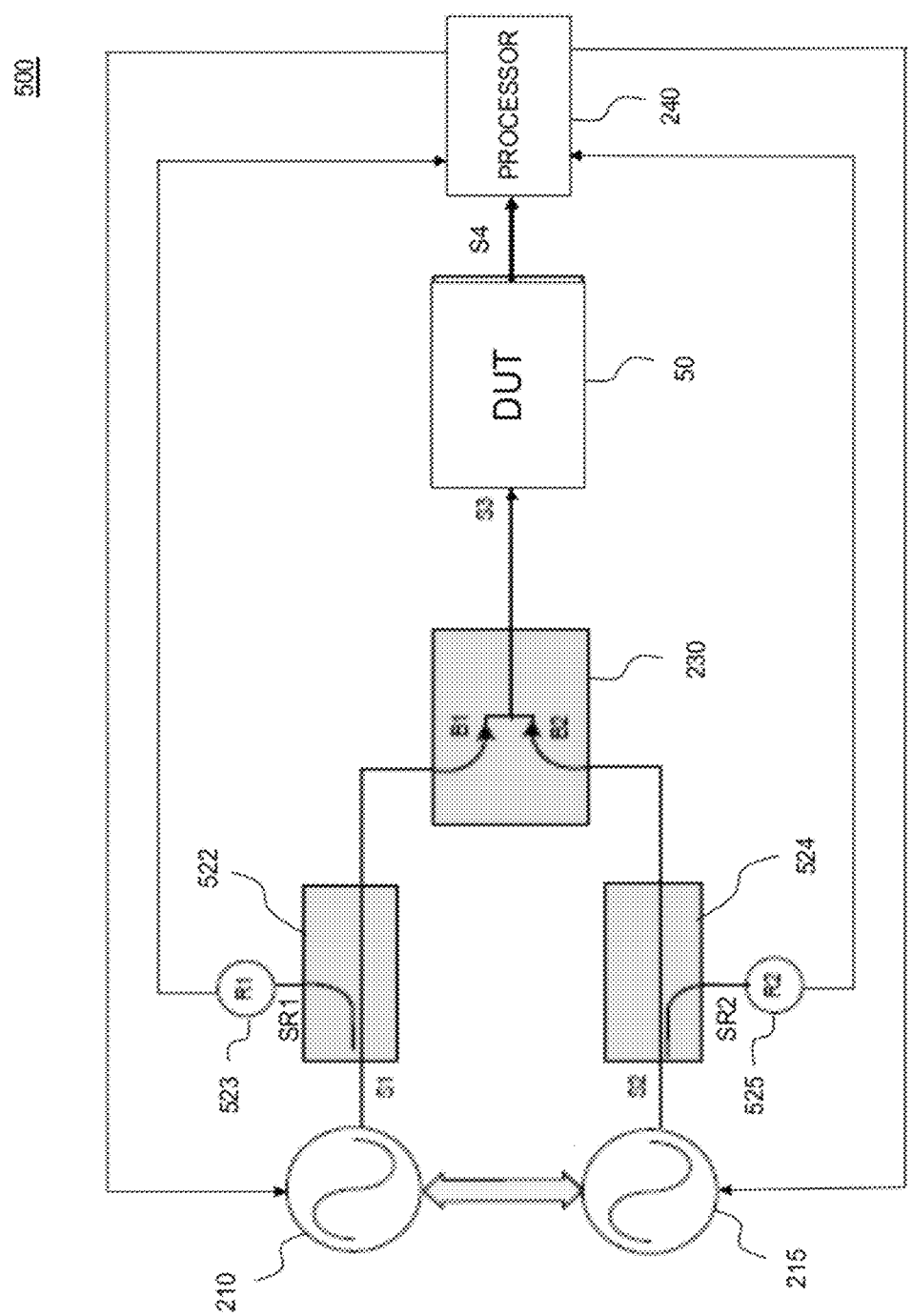
FIG. 5 illustrates another example embodiment of an arrangement for measuring the linearity of a DUT using two periodic signals.

In another embodiment, the peak amplitudes B1 and B2 and the phase difference $\Delta\theta$ may be determined using separate detectors, as illustrated with respect to FIG. 5.

FIG. 5 illustrates another example embodiment of an arrangement 500 for measuring the linearity of DUT 50 using two periodic signals. The arrangement 500 is identical to the arrangement 200 described above, except for the addition of: a first directional coupler 522 in a signal path between first signal generator 210 and signal combiner 230; a first detector 523 connected to a coupling output port of first directional coupler 522 and configured to output to processor 240 a first detected signal; a second directional coupler 524 in a signal path between second signal generator 215 and signal combiner 230; and a second detector 525 connected to a coupling output port of second directional coupler 524 and configured to output to processor 240 a second detected signal.

As a beneficial feature, first and second directional couplers 522 and 524 are time invariant linear directional couplers and first and second detectors 523 and 525 are time invariant linear detectors. Because first and second directional couplers 522 and 524 and first and second detectors 523 and 525 are linear and time invariant, the difference between the detected phases of a first coupled signal SR1 from first directional coupler 522 and a second coupled signal SR2 from second directional coupler 524 is equal to $\Delta\theta$ plus a constant offset. The same detectors (first and second detectors 523 and 525) can also be used to measure the amplitudes of first sinusoidal signal S1 (i.e., A1), and second sinusoidal signal S2 (i.e., A2).

Using the process described above, the output signal levels of first and second signal generators 210 and 215 are set so that B1 and B2 are equal. Then, the phase difference $\Delta\theta$ between the first and second sinusoidal signals S1 and S2 is varied until the power level detected by DUT 50 is either:

(I) At a maximum point 422 as shown in FIG. 4; in this case, $\Delta\theta$ is 0;

(II) At a minimum point 424 as shown in FIG. 4; in this case, $\Delta\theta$ is $\pi$ radians.

(III) At the same level as the single source power condition. In this case, B3=B1 and therefore $\cos(\Delta\theta)$=0.5, as shown at the single power points 450 of the solid line 410 and the dotted curve 420 in FIG. 4.

Option (I) is problematic due to the tiny variation in power level around the maximum point 422 leading to phase uncertainty. Option (II) is problematic due to the exaggerated effects of noise at the minimum point 424. Meanwhile, Option (III) does not depend upon the linearity of first and second detectors 523 and 525, is less susceptible to noise than Option (II), and is at a point in the waveform at which the power level changes quickly with phase, so that the phase uncertainty is minimized. Option (III) can be produced at two different values of $\Delta\theta$, but these two values are easily distinguishable.

At one of the above power levels for which the phase difference $\Delta\theta$ of the combined signal S3 is known, the first and second detectors 523 and 525 measure the difference in the phase between first and second coupled signals SR1 and SR2, and the difference between this measurement and the known phase difference $\Delta\theta$ of the combined signal S3 is recorded and used as an offset to determine the phase difference $\Delta\theta$ in subsequent measurements.

Also, it should be noted that the signal amplitude measured by reference detector R1 is proportional to B1, and the signal amplitude measured by reference detector R2 is proportional to B2. This fact can be used to maintain a constant value for the peak amplitudes A1 and A2 of the first and second sinusoidal signals S1 and S2 output by first and second signal generators 210 and 215.

In a second example embodiment of method 300 of determining the linearity of DUT 50, the second periodic signal S2 has a frequency difference with respect to the first periodic signal S1, and the linearity of DUT 50 is determined based on this frequency difference. A more detailed description of such an example embodiment is now provided.

In general, one can express the first and second periodic signals S1 and S2 having a constant frequency difference and a phase difference with respect to each other, as:

$$S1 = A1 * \cos(\omega * t + \phi), \text{ and} \quad (10)$$

$$S2 = A2 * \cos[(\omega + \delta) * t + \theta], \quad (11)$$

where $\omega = 2\pi f$, f=frequency, t=time, $\delta$ is the constant frequency difference between the second periodic signal S2 and the first periodic signal S1, and $\phi$ and $\theta$ and A1 and A2 are scalar constants, as before.

The combined signal, S3, is the sum of the first periodic signal S1 and the second periodic signal S2, with an additional gain factor and phase offset due to the loss and delay of signal combiner 230, and can be expressed as:

$$S3 = B1*\cos(\omega*t+\phi')+B2*\cos[(\omega+\delta)*t+\theta'], \quad (12)$$

where $\phi'$ and $\theta'$ are scalar constants representing the phase values $\phi$ and $\theta$, respectively, phase shifted by corresponding phase amounts by signal combiner 230, and B1 and B2 are scalar constants representing peak amplitudes A1 and A2 adjusted by corresponding amplitude gains/losses by signal combiner 230, as before. Thus it is seen that the combined signal S3 includes a component of the first periodic signal S1 having a peak amplitude B1 and a phase value $\phi'$, and further includes a component of the second periodic signal S2 having a peak amplitude B2 and a phase value $\theta'$.

As before, in general B1 and B2 can have any realizable values, but in a beneficial embodiment, A1 and A2 are selected such that B1=B2. In that case:

$$S_3 = B_3 * \cos\left[\left(\omega + \frac{\delta}{2}\right) * t + \Phi\right], \text{ where:} \quad (13)$$

$$B3 = 2*B1*\cos\left(\Theta - \frac{\delta*t}{2}\right); \quad (14)$$

$$\Theta = \frac{\phi' - \theta'}{2}; \text{ and} \quad (15)$$

$$\Phi = \frac{(\phi' + \theta')}{2}. \quad (16)$$

Again, when DUT 50 is a typical detector, it will detect the envelope of the combined signal S3 which is the absolute value or magnitude of B3. Thus, as shown in equation (14), DUT 50 detects the absolute value of $$2*B1*\cos\left(\Theta - \frac{\delta*t}{2}\right)$$

which is a periodic signal as a function of time with a frequency of $\delta/2$ radians per second.

Figure 6:
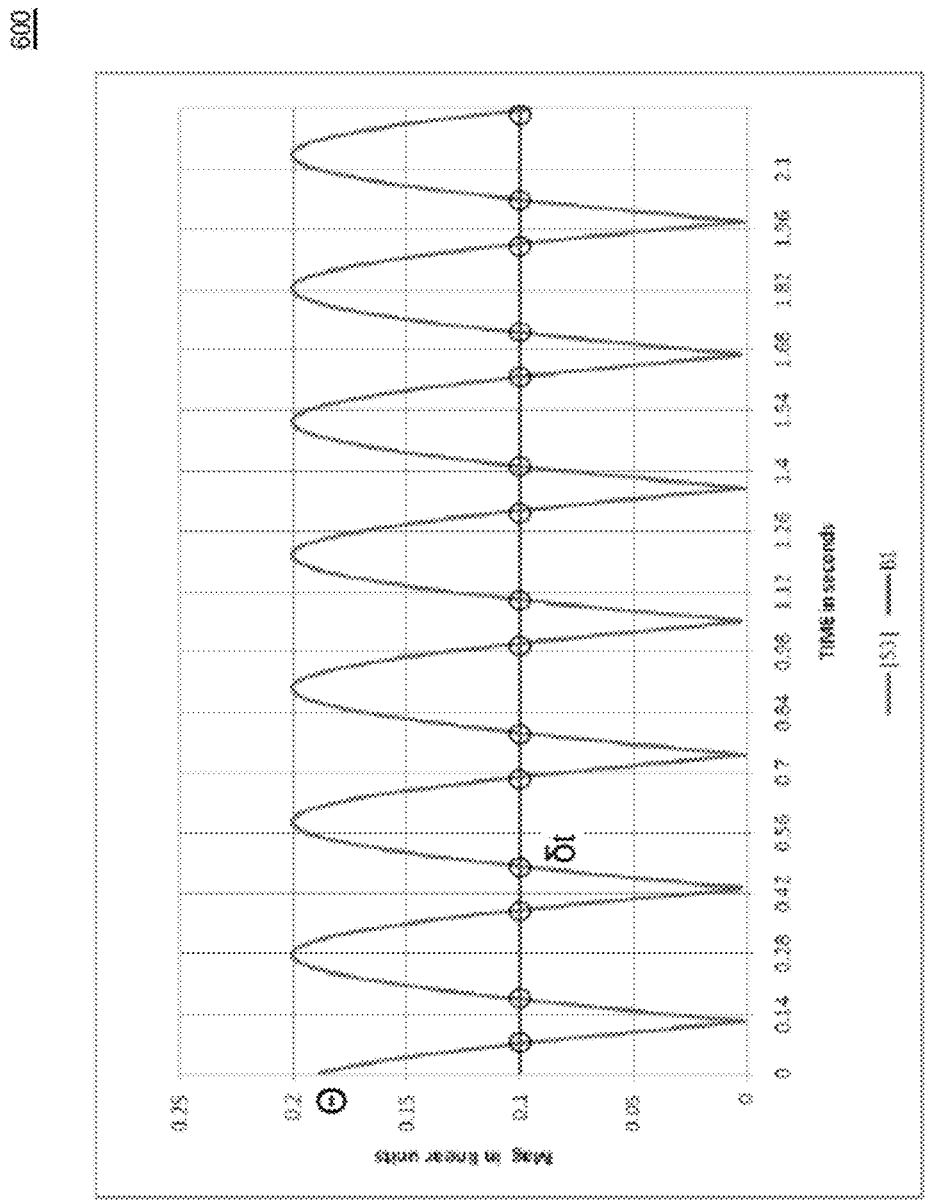
FIG. 6 illustrates another example embodiment of an ideal output response of a DUT in the arrangement of FIG. 2.

FIG. 6 illustrates an example embodiment of an output response of DUT 50 as a function of time in the arrangement of FIG. 2 when DUT 50 is an ideal device and there is a fixed frequency difference between the second periodic signal S2 and the first periodic signal S1. In particular, FIG. 6 plots the absolute value or magnitude of $$2*B1*\cos\left(\Theta - \frac{\delta*t}{2}\right)$$

(i.e., an absolute value or magnitude of a cosine function of the frequency difference $\delta$ multiplied by time t) as a function of time, with $\delta=2*\pi*6$, $\Theta\approx20°$, and B1=0.1. The circled intercept points in FIG. 6 are key defined points that may be used to extract the actual values of the frequency difference $\delta$ and the phase difference value $\Theta$ from the output signal S4 of DUT 50.

In some embodiments, DUT 50 may make multiple measurements of the absolute value or magnitude of B3 of the combined signal S3, and processor 240 may average the comparison between the measured absolute value or magnitude of B3 and the ideal response of FIG. 6 over several periods of the cosine function. Averaging may be employed to reduce jitter and noise.

In some embodiments, processor 240 analyzes the output signal S4 of DUT at periodic intervals. In that case, the frequency difference $\delta$ may be selected such that many periodic measurements of the absolute value or magnitude of B3 are made by DUT 50 for each period of the combined signal S3.

The phase difference $\Theta$ is determined from observation of the periodic response of the output signal S4 of DUT 50. In particular, by observing the time period between the circled points in FIG. 6 at which |S3|=B1, the values of Θ and δ can be determined as shown in FIG. 6. It should be noted that this determination is not affected by the linearity of DUT 50, since all determinations are made with the same power applied to DUT 50. It should also be noted that accuracy of the frequency settings and measurement rate settings are not critical.

The frequency difference δ may also be determined from a priori knowledge of the frequency difference or offset between the first and second sinusoidal signals S1 and S2 output by first and second signal generators 215 and 220 based on the settings of first and second signal generators 215 and 220, which may be controlled by processor 240 as shown for example in FIGS. 2 and 5.

The phase difference value Θ and the frequency difference δ may also be determined by modifying their values to minimize the difference between the formula |B3|=|2*B1*cos(δ*t/2−Θ)| and the observed response of the output signal S4 of DUT 50, and also by observing the number of sample points between crossings of B1. This minimization process does not impact the end results since the observed data is preserved and only the systematic errors of instrument settings are removed.

If filters are used in DUT 50, it is important to keep ω and ω+δ within the flat region of the filter's passband to minimize linearity errors due to the filter.

In some embodiments of the frequency difference method of determining the linearity of DUT 50, a change in the output signal S4 at two different times may be compared against the ideal response as found in equation:

$$\frac{|S3_2|^2}{|S3_1|^2} = \frac{\left|\cos\left(\frac{\delta * t_2}{2} - \Theta\right)\right|^2}{\left|\cos\left(\frac{\delta * t_1}{2} - \Theta\right)\right|^2}, \quad (17)$$

where $S3_1$ is the combined signal at time $t_1$, and $S3_2$ is the combined signal at the time $t_2$.

As illustrated in FIGS. 4 and 6, the cosine function has a very steep slope as the phase change approaches 180 degrees. This increases the sensitivity of the output signal S4 of DUT 50 to small errors in time or phase. To reduce this sensitivity, in some embodiments the measurements are limited to a range of 145° of phase change in the cosine function. This is equivalent to 12 dB of input power level change.

Figure 7:
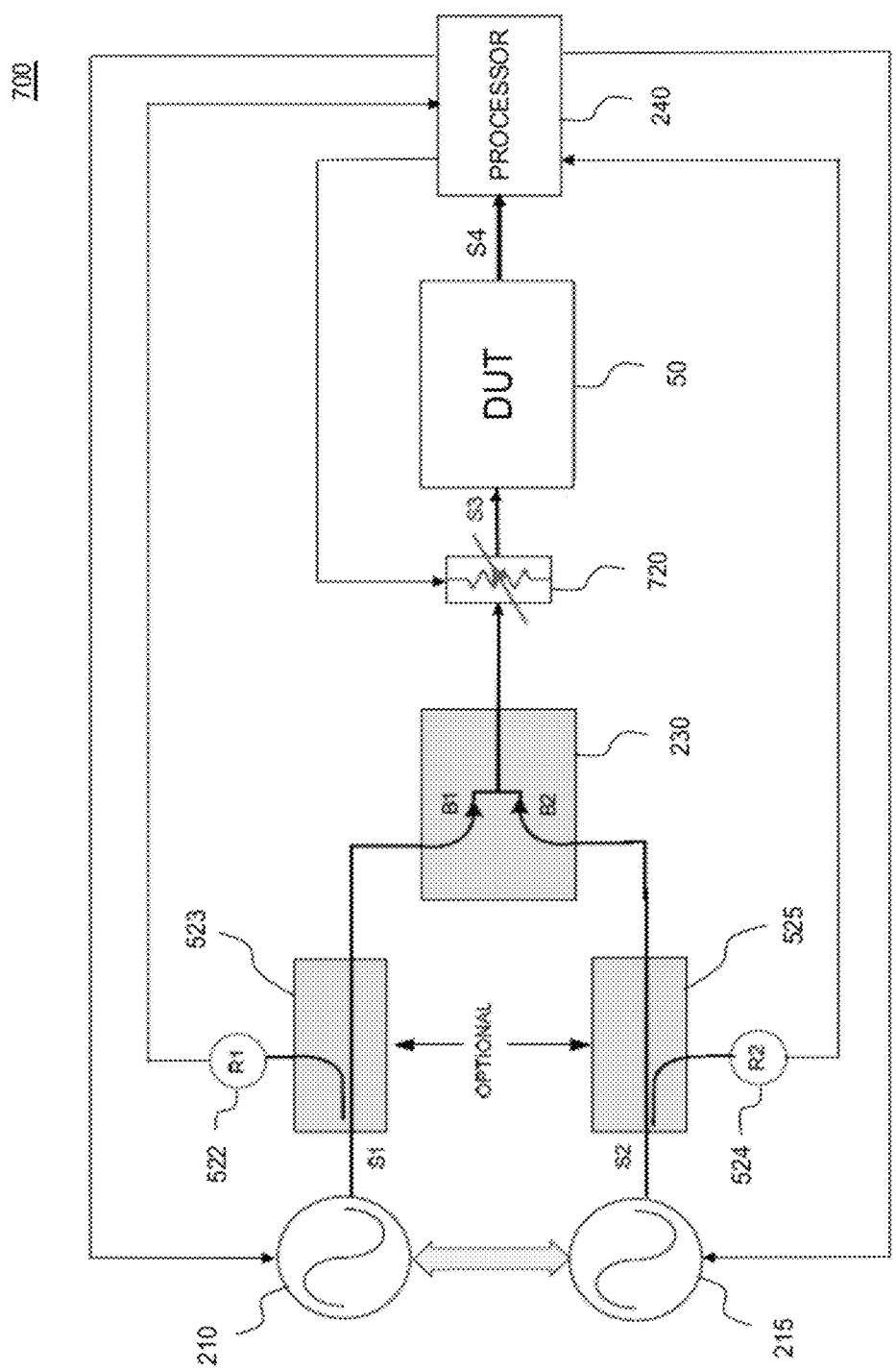
FIG. 7 illustrates yet another example embodiment of an arrangement for measuring the linearity of a DUT using two periodic signals.

Toward that end, FIG. 7 illustrates yet another example embodiment of an arrangement 700 for measuring the linearity of DUT 50 using two periodic signals. The arrangement 700 is identical to the arrangement 500 described above, except for the addition of a variable attenuator 720. That is, in order to measure the linearity of DUT 50 over a wider range of changes in power level, variable attenuator 720 is added to the arrangement, as illustrated by FIG. 7, to increase the measurement dynamic range. In the arrangement 700, variable attenuator 720 is stepped through increasing attenuation values, for example in 10 dB increments, and linearity measurements are made as described above for the attenuated combined signal at each attenuation value.

Figure 8:
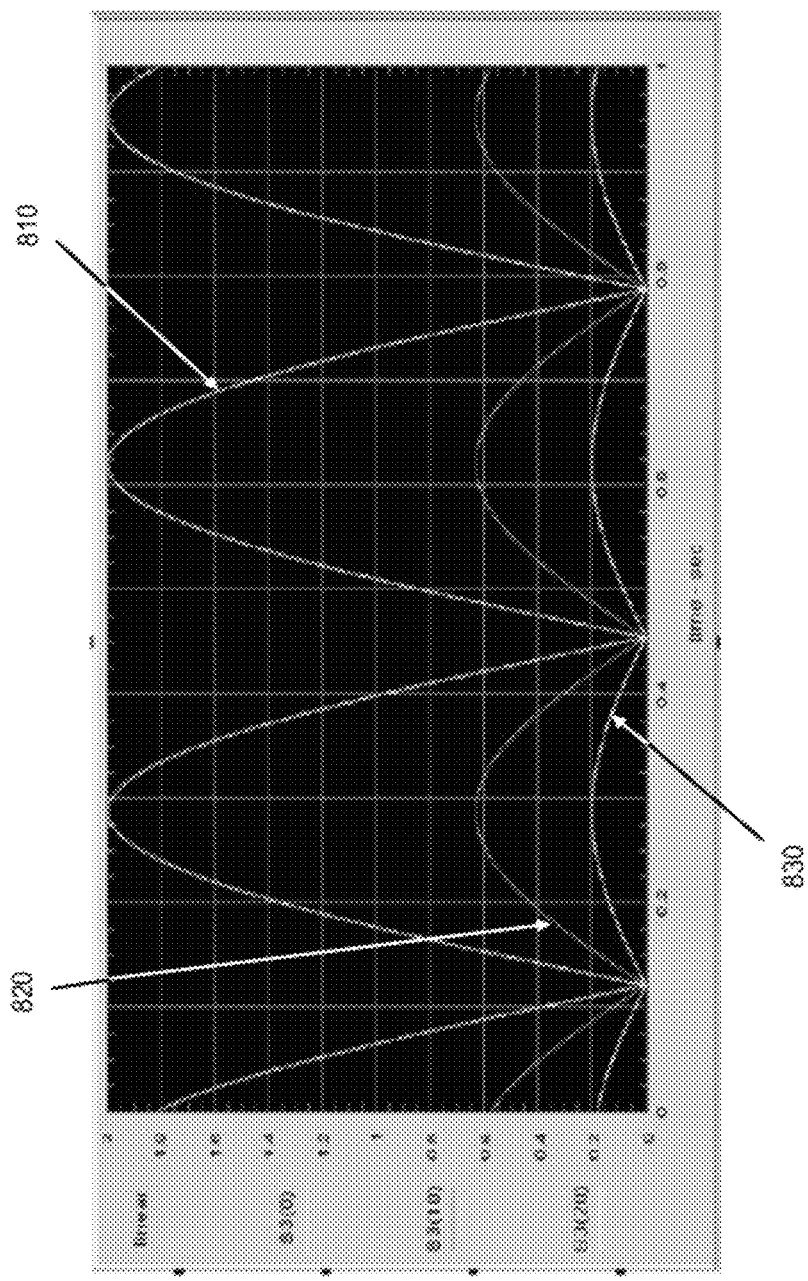
FIG. 8 illustrates an example embodiment of an ideal output response of a DUT in the arrangement of FIG. 7 for various attenuation settings.

FIG. 8 illustrates the absolute value or magnitude of B3 as a function of time for the combined signal S3 that is provided to DUT 50 for various attenuation values of variable attenuator 720 in an example embodiment of arrangement 700. FIG. 8 also illustrates an ideal output response of DUT 50 as a function of time in the example embodiment of arrangement 700 for various attenuation values provided by variable attenuator 720 when the first and second sinusoidal signals S1 and S2 have a fixed frequency difference between them. Attenuation values of 0 dB, 10 dB and 20 dB are shown in the plots 810, 820 and 830, respectively. This technique allows the combined signal S3 to cover a very wide dynamic range while avoiding the high sensitivity region of the cosine function around 180 degrees, as seen for example in FIGS. 4 and 6. Since 12 dB of power change is covered for each 10 dB step attenuation value, overlapping power level points are provided so that processor 240 can stitch together the plots 810, 820 and 830 to produce a response covering a wide dynamic range. Since only ratios are employed, the absolute accuracy of variable attenuator 720 is irrelevant. The amplitudes of the first sinusoidal signal S1 and the second sinusoidal signal S2 are kept constant throughout the linearity measurements with the attenuated combined signal.

In particular, processor 240 determines a first portion of the time varying characteristic of the output signal S4 of DUT 50 over a specified range of angles less than 180 with the combined signal S3 applied to the DUT 50 at a first attenuation setting (e.g., 0 dB). Then the attenuation of variable attenuator 720 is adjusted to provide multiple power settings. For example, the attenuation may be adjusted in steps of 10 db, for example by processor 240. Processor 240 generates a second portion of the time varying characteristic of the output signal S4 of the DUT 50 with the attenuated combined signal S3 applied to DUT. This process may be repeated again for additional attenuation values (e.g., in 10 dB steps) as desired to obtain additional portions of the time varying characteristic of the output signal S4 of the DUT 50. Finally, processor 240 stitches together the first portion of the time varying characteristic of the output signal S4 and the second portion of the time varying characteristic of the output signal S4 (and any additional portions that were acquired) (and any additional portions of the time varying characteristic of the output signal S4 produced at additional attenuation settings) to produce the time varying characteristic of the output signal.

Figure 1B:
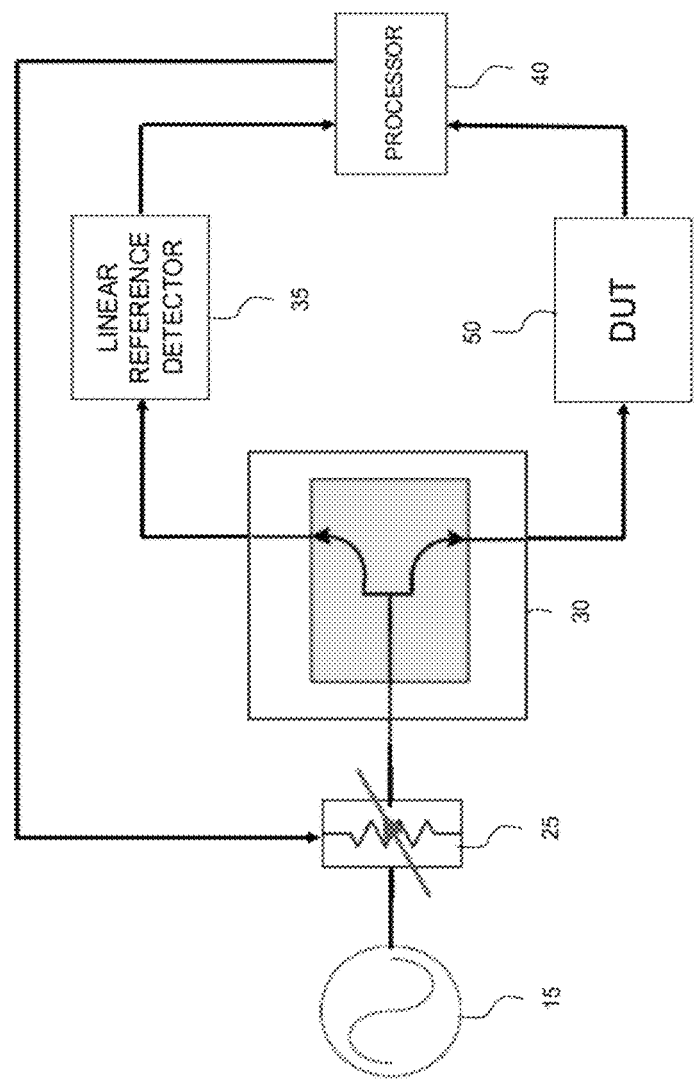
Figure 9:
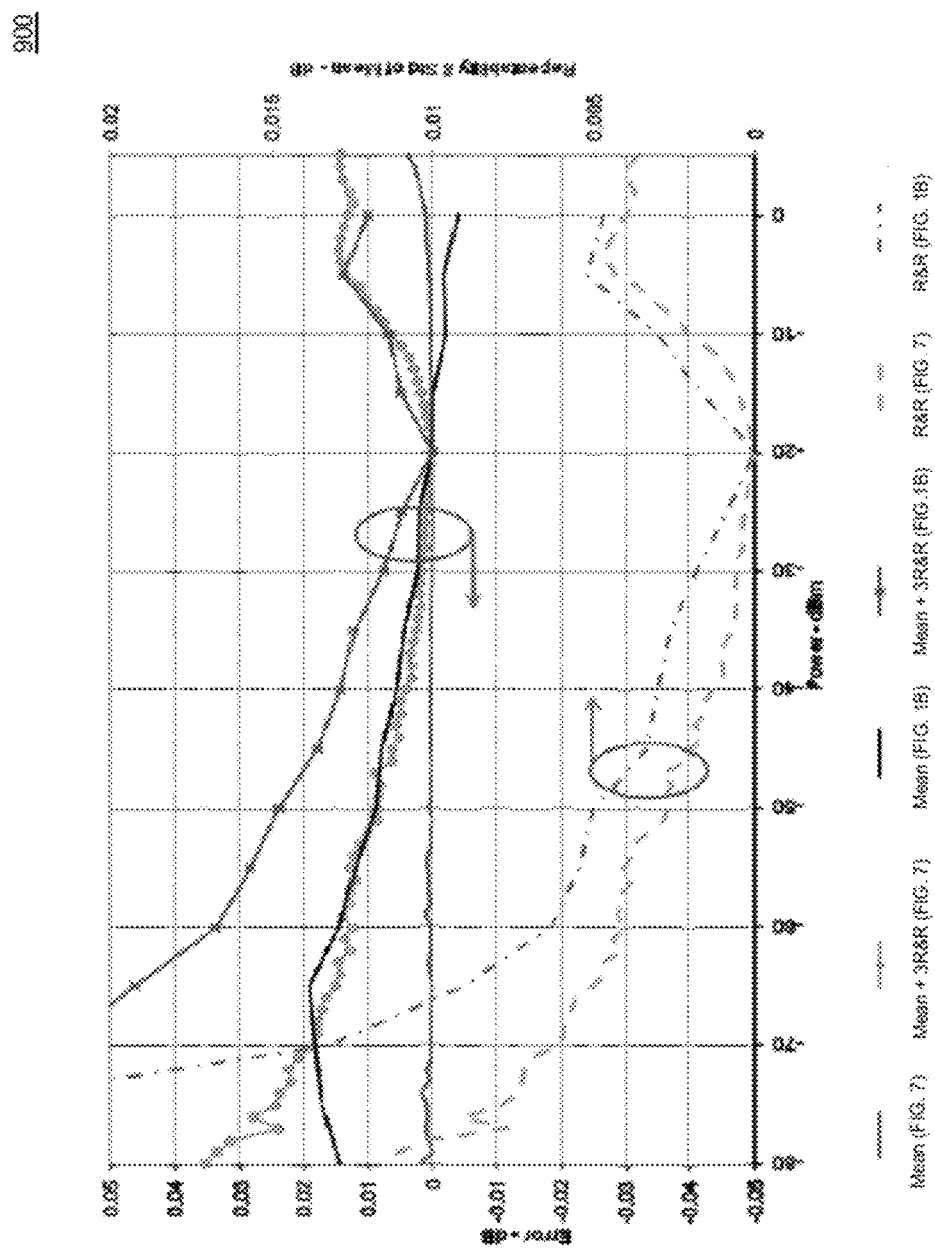
FIG. 9 compares examples of the mean error and repeatability & reproducibility variation of linearity measurements made using an example embodiment of an arrangement as illustrated in FIG. 7, and an example of an arrangement as illustrated in FIG. 1B.

FIG. 9 shows a plot 900 that illustrates and compares examples of the mean error and the repeatability & reproducibility variation (R&R) of linearity measurements made using an example embodiment of an arrangement as illustrated FIG. 7, and an example arrangement as illustrated in FIG. 1B. In particular, FIG. 9 plots mean error, R&R, and (mean error+3 R&R) values as a function of input power level at a DUT of linearity measurements performed using an example embodiment of an arrangement as illustrated FIG. 7, and an example arrangement as illustrated in FIG. 1B. As can be seen in FIG. 9, the mean error of the linearity measurements made using the example embodiment of the arrangement as illustrated FIG. 7 is less than the mean error of the linearity measurements made using the example arrangement as illustrated in FIG. 1B, and the R&R of the linearity measurements made using the example embodiment of an arrangement as illustrated FIG. 7 is less than the R&R of the linearity measurements made using the example arrangement as illustrated in FIG. 1B.

In embodiments described above, methods have been described for determining device linearity by employing systems with first and second signal generators 210 and 215, which can provide an output signal with a power change that can be precisely determined by the phase difference or frequency difference between the first and second signal generators 210 and 215. However such systems may be employed in a variety of other contexts besides measuring device linearity. One example use of such a system is to determine whether or not one or more particular RF signals are present or absent at a particular location, for example to address the so-called "white-space" problem with some smart radio systems that search for TV or radio channels that are unoccupied so that these channels may be used for wireless communications by the smart radio systems. In some of these applications, systems such as arrangements 200, 500, and 700 of FIGS. 2, 5 and 7 may be employed, with a receiver configured to measure the phase difference or the frequency difference between the first and second signal generators 210 and 215 substituted in place of the device-under-test 50.

While example embodiments are disclosed herein, one of ordinary skill in the art appreciates that many variations that are in accordance with the present teachings are possible and remain within the scope of the appended claims. The invention therefore is not to be restricted except within the scope of the appended claims.

The invention claimed is:

1. A method, comprising:
    providing a control signal to control a frequency and/or a phase of a first periodic signal, and/or a frequency and/or a phase of a second periodic signal;
    combining the first periodic signal and the second periodic signal to produce a combined signal, wherein the second periodic signal has at least one of a phase difference and a frequency difference with respect to the first periodic signal;
    applying the combined signal to an input of a device;
    determining a linearity of the device from an output signal of the device based on the at least one of the phase difference and frequency difference between the first periodic signal and the second periodic signal, wherein the first periodic signal and the second periodic signal are phase coherent during the determining of the linearity of the device;
    controlling a peak amplitude of a component of the first periodic signal present in the combined signal to be equal to a peak amplitude of a component of the second periodic signal present in the combined signal;
    determining the frequency difference between the first periodic signal and the second periodic signal from a time varying characteristic of the output signal of the device; and
    comparing the time varying characteristic of the output signal of the device to a time varying characteristic of an absolute value of a cosine function of the frequency difference multiplied by time, wherein the second periodic signal has the frequency difference with respect to the first periodic signal, and wherein the linearity of the device is determined from a time varying characteristic of the output signal of the device.

2. The method of claim 1, wherein the second periodic signal has the phase difference with respect to the first periodic signal, and wherein the phase difference is varied to determine the linearity of the device.

3. The method of claim 2, further comprising comparing: (1) a measured response of the device as a function of a phase difference between a component of the first periodic signal present in the combined signal and a component of the second periodic signal present in the combined signal, to (2) a theoretical response for an ideal linear device.

4. The method of claim 2, further comprising controlling a peak amplitude of a component of the first periodic signal present in the combined signal to be equal to a peak amplitude of a component of the second periodic signal present in the combined signal.

5. The method of claim 4, wherein controlling the peak amplitude of the component of the first periodic signal present in the combined signal to be equal to the peak amplitude of the component of the second periodic signal present in the combined signal comprises:
    setting a peak amplitude of the second periodic signal to zero;
    with the peak amplitude of the second periodic signal at zero, adjusting the peak amplitude of the component of the first periodic signal present in the combined signal to have a first value;
    setting a peak amplitude of the first periodic signal to zero; and
    with the peak amplitude of the first periodic signal at zero, adjusting the peak amplitude of the component of the second periodic signal present in the combined signal to have the first value.

6. The method of claim 4, further comprising comparing a measured response of the device to an absolute value of a cosine function of the phase difference between the component of the first periodic signal present in the combined signal and the component of the second periodic signal present in the combined signal.

7. The method of claim 1, further comprising averaging the comparison over several periods of the cosine function.

8. The method of claim 7, further comprising:
    determining a first portion of the time varying characteristic of the output signal of the device over a specified range of angles less than 180 degrees with the combined signal applied to the device;
    attenuating the combined signal by an attenuation value;
    generating a second portion of the time varying characteristic of the output signal of the device with the attenuated combined signal applied to the device; and
    stitching together the first portion of the time varying characteristic of the output signal and second portion of the time varying characteristic of the output signal to produce the time varying characteristic of the output signal.

9. A system, comprising:
    a first signal generator configured to output a first periodic signal;
    a second signal generator configured to output a second periodic signal, wherein the second periodic signal has at least one of a phase difference and a frequency difference with respect to the first periodic signal wherein the second periodic signal has the frequency difference with respect to the first periodic signal;
    a signal combiner configured to combine the first periodic signal and a second periodic signal to produce a combined signal and to supply the combined signal to a device;
    a processor configured to: determine a linearity of the device from an output signal of the device based on the at least one of the phase difference and frequency difference between the first periodic signal and the second periodic signal; and to compare a time varying characteristic of the output signal of the device to a time varying characteristic of an absolute value of a cosine function of the frequency difference multiplied by time, wherein the processor is configured to determine the linearity of the device from the time varying characteristic of the output signal of the device, wherein the second periodic signal has the phase difference with respect to the first periodic signal, and wherein the processor is configured to determine the linearity of the device from the output signal of the device in response to the phase difference being varied.

10. The system of claim 9, wherein the processor supplies at least one control signal to at least one of the first signal generator and the second signal generator to vary the phase difference.

11. The system of claim 9, further comprising:
a first time invariant linear directional coupler in a signal path between the first signal generator and the signal combiner;
a first detector connected to a coupling output port of the first time invariant linear directional coupler and configured to output to the processor a first detected signal;
a second time invariant linear directional coupler in a signal path between the second signal generator and the signal combiner; and
a second detector connected to a coupling output port of the second time invariant linear directional coupler and configured to output to the processor a second detected signal,
wherein the processor is configured to determine a phase difference between a component of the first periodic signal present in the combined signal and a component of the second periodic signal present in the combined signal based on the first detected signal and the second detected signal.

12. The system of claim 11, wherein the processor is further configured to determine a peak amplitude of the component of the first periodic signal present in the combined signal and a peak amplitude of the component of the second periodic signal present in the combined signal based on the first detected signal and the second detected signal.

* * * * *